(12) United States Patent
Li et al.

(10) Patent No.: US 11,476,405 B2
(45) Date of Patent: Oct. 18, 2022

(54) REUSABLE PIEZOELECTRIC SENSOR FOR DAMAGE IDENTIFICATION

(71) Applicant: Ningbo University, Zhejiang (CN)

(72) Inventors: Junhua Li, Zhejiang (CN); Sicong He, Zhejiang (CN)

(73) Assignee: Ningbo University, Zhejiang (CN)

( * ) Notice: Subject to any disclaimer, the term of this patent is extended or adjusted under 35 U.S.C. 154(b) by 329 days.

(21) Appl. No.: 16/925,147

(22) Filed: Jul. 9, 2020

(65) Prior Publication Data
US 2021/0013393 A1  Jan. 14, 2021

(30) Foreign Application Priority Data
Jul. 10, 2019 (CN) .......................... 201910619231.3

(51) Int. Cl.
| | | |
|---|---|---|
| *G06F 3/02* | (2006.01) | |
| *H01L 41/053* | (2006.01) | |
| *H01L 41/113* | (2006.01) | |
| *H01L 41/187* | (2006.01) | |
| *G01L 1/16* | (2006.01) | |

(52) U.S. Cl.
CPC ........ *H01L 41/053* (2013.01); *H01L 41/1132* (2013.01); *H01L 41/187* (2013.01); *G01L 1/16* (2013.01)

(58) Field of Classification Search
CPC . H01L 41/053; H01L 41/1132; H01L 41/187; G01L 1/16; G06F 3/033; G06F 3/02; G09G 5/08; G09G 5/00
See application file for complete search history.

(56) References Cited

U.S. PATENT DOCUMENTS

| | | | | |
|---|---|---|---|---|
| 4,947,075 A | * | 8/1990 | Maury | H04R 17/00 310/330 |
| 5,371,428 A | * | 12/1994 | Kikuchi | H04R 17/00 310/322 |
| 5,955,821 A | * | 9/1999 | Yamamoto | G10K 9/122 310/326 |
| 6,472,797 B1 | * | 10/2002 | Kishimoto | H04R 17/00 310/324 |
| 2016/0254436 A1 | * | 9/2016 | Fukuoka | H01L 41/0471 310/366 |

* cited by examiner

*Primary Examiner* — Pegeman Karimi
(74) *Attorney, Agent, or Firm* — Renner, Otto, Boisselle & Sklar, LLP

(57) ABSTRACT

A reusable piezoelectric sensor for damage identification includes a piezoelectric ceramic plate and a metal box bonded to the surface of a test piece, where a wire through hole is formed in the center of a top plate of the metal box, and a side wall of the metal box extends vertically upwards to form a striking face for being struck to remove the metal box from the test piece; the piezoelectric ceramic plate arranged in the metal box is closely and fixedly bonded to a bottom plate of the metal box; and wires of the piezoelectric ceramic plate penetrate through the wire through hole to be connected to an external impedance analyzer. The reusable piezoelectric sensor for damage identification is easy to manufacture and convenient to operate and can effectively eliminate the testing error caused by the difference of the piezoelectric ceramic plate.

12 Claims, 4 Drawing Sheets

REUSABLE PIEZOELECTRIC SENSOR FOR DAMAGE IDENTIFICATION

TECHNICAL FIELD

The present invention belongs to the technical field of sensors, and particularly relates to a reusable piezoelectric sensor for damage identification.

BACKGROUND

Piezoelectric elements have electromechanical conversion and driving and sensing functions. In recent years, researchers showed wide interest in development of piezoelectric elements as sensors. There are piezoelectric ceramic sensors based on 3D printing automation encapsulation, tensile piezoelectric sensors for logistics monitoring, high-sensitivity piezoelectric micro-electro-mechanical system (EMES) sensors, and piezoelectric acceleration sensors.

A lead zirconate titanate piezoelectric ceramic plate (PZT) used as a sensing element due to its piezoelectric effect and dielectricity is a common piezoelectric material of the piezoelectric elements and has a vast space for development in the field of machinery and civil engineering. The piezoelectric impedance technology has been widely applied to health monitoring and damage diagnosis of structures according to the features of the lead zirconate titanate piezoelectric ceramic plate (PZT). For example, by adoption of the piezoelectric impedance technology, the grouting density of an assembled reinforced sleeve can be identified, bolt looseness in machinery can be monitored, research on the development of a concrete crack depth can be performed, and damage to a steel truss can be identified. The piezoelectric impedance technology has gradually developed into a novel nondestructive testing technology by virtue of high sensitivities to damage, low costs, good effects, and real-time monitoring of piezoelectric sensors.

The piezoelectric impedance technology identifies damage to the structures according to a change, caused during coupled vibration of a piezoelectric ceramic plate and a member, to modal parameters. In this case, it is necessary to fixedly bond one end of the piezoelectric ceramic plate to a main member to form a one-dimensional piezoelectric impedance model for the coupled vibration, so that electric energy and mechanical energy can be converted mutually. When damage to different portions of one structure needs to be identified or damage to different structures needs to be compared, because the piezoelectric ceramic plate which has been fixedly bonded cannot be removed for repeated use, a plurality of piezoelectric ceramic plates need to be bonded to different sites to identify the damage. However, the piezoelectric ceramic plates are piezoelectric crystals having different parameters, such as a piezoelectric constant and a dielectric constant, and different natural frequencies of vibration, and consequentially, electrical signals fed back from different piezoelectric ceramic plates are quite different, resulting in considerable errors on damage identification results. Thus, this problem needs to be solved urgently.

SUMMARY

The technical issue to be settled by the present invention is to provide a reusable piezoelectric sensor for damage identification, which is easy to manufacture and convenient to operate and can effectively eliminate the testing error caused by the difference of a piezoelectric ceramic plate.

The technical solution adopted by the present invention to settle the above-mentioned technical issue is as follows: a reusable piezoelectric sensor for damage identification includes a piezoelectric ceramic plate and a metal box for being bonded to the surface of a test piece, where a wire through hole is formed in the center of a top plate of the metal box, and a side wall of the metal box extends vertically upwards to form a striking face for being struck to remove the metal box from the test piece; the piezoelectric ceramic plate arranged in the metal box is closely and fixedly bonded to a bottom plate of the metal box; and wires of the piezoelectric ceramic plate penetrate through the wire through hole to be connected to an external impedance analyzer.

The bottom plate of the metal box is a 0.4-0.6 mm thick thin iron plate, thus being uniformly and fully bonded between the member and the piezoelectric ceramic plate to fulfill close fit without a seam. Accordingly, measurement accuracy is guaranteed. It has been experimentally demonstrated that the electromechanical coupled effect of the piezoelectric ceramic plate cannot be affected by the thin iron plate. Accordingly, the piezoelectric ceramic plate can still accurately measure a change to mechanical impedance of the member and feed an impedance signal back to identify damage to the member.

The 1.5-2 mm thick striking face, the remaining 1-1.5 mm thick side walls, and the 1-1.5 mm thick top plate of the metal box are all made of iron, so that the sensor is rigid in structure and will not be damaged or worn when struck. The piezoelectric ceramic plate in the metal box is indirectly protected against damage.

The metal box is superficially coated with zinc, so that the sensor will not corrode or rust and thus has no influence on measurement and calculation testing results.

The bottom plate and the top plate of the metal box are square, and the piezoelectric ceramic plate is a 0.4 mm thick wafer having an electromechanical coupling coefficient not less than 0.56 and a diameter of 16 mm, and is arranged in the center of the bottom plate of the metal box.

Two flexible wires wrapped with insulating layers are welded to the piezoelectric ceramic plate, so that conductors of the two wires are not in contact with the metal box, thus eliminating signal interference.

Compared with the prior art, the present invention has the following advantages: the present invention is the first to disclose the reusable piezoelectric sensor for damage identification; the bottom of the metal box is bonded to the surface of the test piece (concrete and steel), and the sensor can be repeatedly bonded to and separated from the test piece. In this way, the piezoelectric ceramic plate for damage identification can be repeatedly used under the premise of nondestructive testing; the whole structure is simple, practical, easy to machine and operate, and low in cost, and can save the piezoelectric ceramic plate, thus obtaining greater economic benefits. The piezoelectric ceramic plate as a test element is arranged in a sealed environment to be protected and to effectively reduce signal interference caused by external noises and vibration, thus improving the measurement accuracy; one side wall of the metal box extends to form the striking face for being struck to remove the sensor. By means of the above structure, the sensor is difficult to wear when struck, and is easy to remove by being struck to be used repeatedly.

In summary, compared with a traditional piezoelectric ceramic plate directly used as a drive or a sensor to identify the damage to the member, the reusable piezoelectric sensor for damage identification of the present invention can be bonded and then struck to be removed repeatedly to measure and calculate damage to all sites on the test piece, thus reducing the testing error, improving the measurement and calculation efficiency, and shortening the time and effort. In addition, the sensor is easy to carry due to its compact structure, and saves test raw materials due to its repeated use, thus being low in cost. Accordingly, the present invention is extremely practical and is widely used in the field of civil engineering, machinery, and so on.

DETAILED DESCRIPTION

Figure 1:
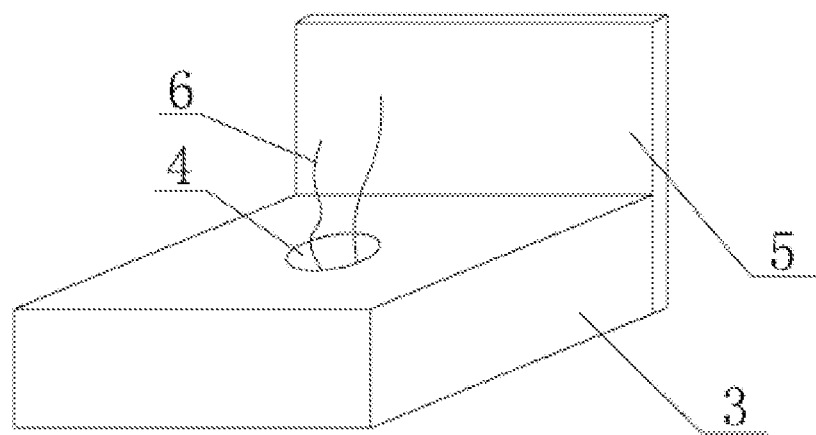
FIG. 1 is a schematic view of an external structure of a piezoelectric sensor of the present invention.
Figure 2:
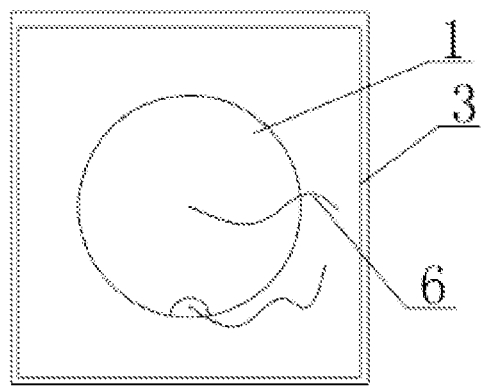
FIG. 2 is a schematic view of an internal structure of a metal box of the piezoelectric sensor of the present invention.
Figure 3:
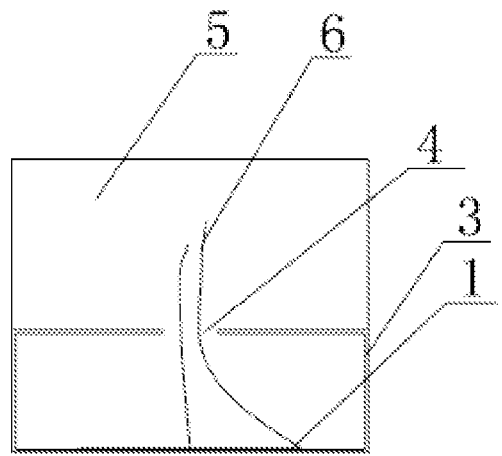
FIG. 3 is a sectional view of the piezoelectric sensor of the present invention.

The present invention is further described below with reference to the accompanying drawings and examples.

I. Specific Example

As shown in FIG. 1, FIG. 2, FIG. 3, and FIG. 4, a reusable piezoelectric sensor for damage identification includes a piezoelectric ceramic plate 1 and a metal box 3 for being bonded to the surface of a test piece 2, where a wire through hole 4 is formed in the center of a top plate of the metal box 3, and a side wall of the metal box 3 extends vertically upwards to form a striking face 5 for being struck to remove the metal box 3 from the test piece 2; the piezoelectric ceramic plate 1 arranged in the metal box 3 is closely and fixedly bonded to a bottom plate of the metal box 3; and wires 6 of the piezoelectric ceramic plate 1 penetrate through the wire through hole 4 to be connected to an external impedance analyzer (not shown in figures).

In this example, the square bottom plate of the metal box 3 is a 0.5 mm thick thin iron plate, the 1.5 mm thick striking face 5, the remaining 1 mm thick side walls, and the 1 mm thick square top plate of the metal box 3 are all made of iron, and the metal box 3 is superficially coated with zinc; the piezoelectric ceramic plate 1 is a 0.4 mm thick wafer having an electromechanical coupling coefficient not less than 0.56 and a diameter of 16 mm, and is arranged in the center of the metal box 3; and two flexible wires 6 wrapped with insulating layers are welded to the piezoelectric ceramic plate 1 used as a core element of the sensor for identifying damage to the member.

Figure 4:
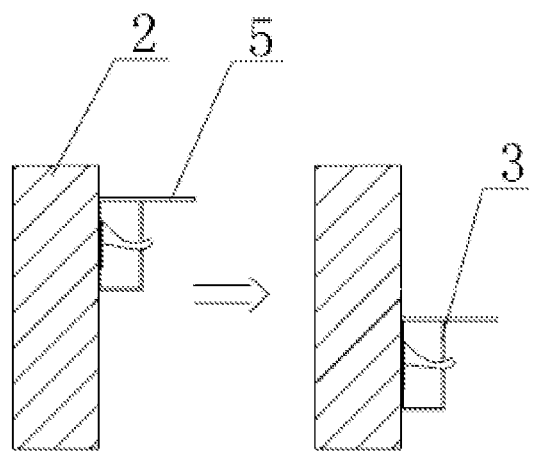
FIG. 4 is a schematic view of an application structure in which the piezoelectric sensor of the prevent invention is bonded to a test piece.

As shown in FIG. 4, the metal box 3 is connected to the test piece 2 during actual operation, and the rear face of the bottom plate of the metal box 3 is closely bonded to upper sites on the surface of the test piece 2 such as concrete and steel with "502" glue; in this case, the sensor operates, the piezoelectric ceramic plate 1 is connected to the impedance analyzer through the wires 6, and the impedance analyzer receives an electrical signal fed back from the piezoelectric ceramic plate 1 to identify damage to the upper sites on the test piece 2. After the damage to the upper sites is measured and calculated, the striking face 5 is struck by hard objects such as a hammer and a spanner to remove the metal box 3. After that, the metal box 3 is bonded to lower sites on the test piece 2, and then the step of identifying the damage to the upper sites on the test piece 2 is repeated to identify damage to the lower sites. By means of the above method, the piezoelectric sensor can be bonded and then struck to be removed repeatedly to measure and calculate damage to all sites on the test piece 2, thus being capable of repeated use.

In addition to the above example, the bottom plate of the metal box 3 may be 0.4 mm thick, 0.6 mm thick, and 0.4-0.6 mm thick, the striking face 5 may be 1.5 mm thick, 2 mm thick, and 1.5-2 mm thick, and the remaining side walls and the top plate of the metal box 3 may be 1 mm thick, 1.5 mm thick, and 1-1.5 mm thick.

II. Comparative Experiment

Figure 5:
FIG. 5 is a conductance curve illustrating damage, measured by directly bonding a piezoelectric ceramic plate to the surface of a concrete sample, to a grouting sleeve at a grouting amount of 20%, 40%, 60%, 80%, and 100%.
Figure 6:
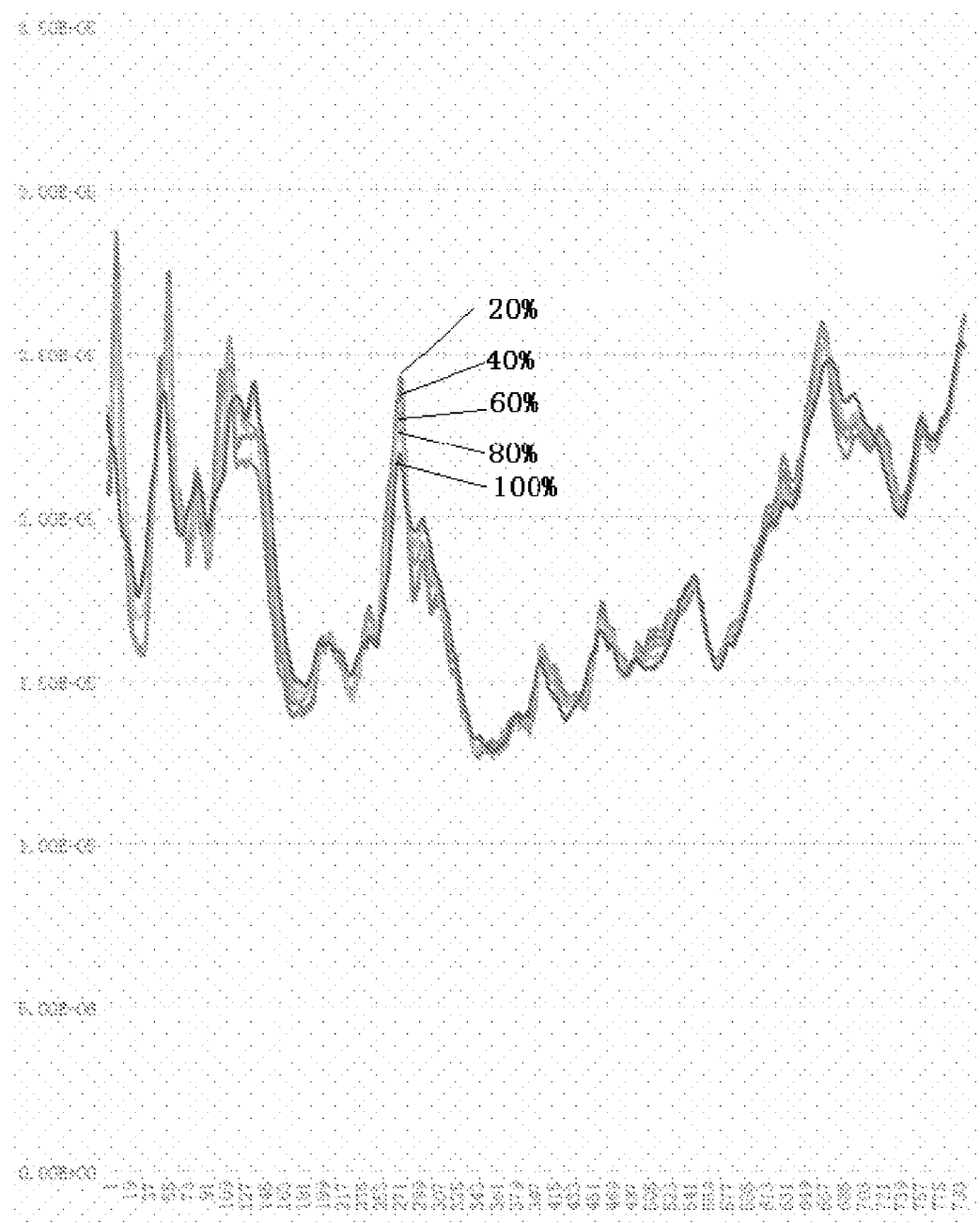
FIG. 6 is a conductance curve illustrating damage, measured by bonding the reusable piezoelectric sensor for damage identification to the surface of the concrete sample, to the grouting sleeve at the grouting amount of 20%, 40%, 60%, 80%, and 100%.

FIG. 5 shows a conductance curve illustrating damage, measured by directly bonding the piezoelectric ceramic plate 1 to the surface of a concrete sample, to a grouting sleeve at a grouting amount of 20%, 40%, 60%, 80%, and 100%. FIG. 6 shows a conductance curve illustrating damage, measured by bonding the reusable piezoelectric sensor for damage identification to the surface of the same concrete sample, to the grouting sleeve at the grouting amount of 20%, 40%, 60%, 80%, and 100%. Where, the conductance curves are obtained by measuring 800 sites at an excitation voltage of 1V and a frequency of 45-85 k by means of a precise impedance analyzer. By comparison, it can be found that although there is a difference between FIG. 5 and FIG. 6, the same conclusion can be reached, that is, at peaks of the conductance curves, a conductance increasingly decreases with the increase of the grouting amount. The conductance curve illustrating the damage identified by the piezoelectric ceramic plate 1 bonded to the iron plate and the conductance curve illustrating the damage identified by the piezoelectric ceramic plate 1 in the reusable piezoelectric sensor for damage identification have the same change rule. The reusable piezoelectric sensor for damage identification of the present invention can be used as a testing tool for identifying the damage to the member.

It should be noted that the above description is not intended to limit the present invention, and the present invention is not limited to the above examples. Changes, modifications, additions or replacements made by those of ordinary skill in the art within the essential range of the present invention should fall within the protection scope of the present invention.

What is claimed is:

1. A reusable piezoelectric sensor for damage identification, comprising a piezoelectric ceramic plate and a metal box for being bonded to a surface of a test piece, wherein a wire through hole is formed in a center of a top plate of the metal box, and a side wall of the metal box extends vertically upwards to form a striking face for being struck to remove the metal box from the test piece; the piezoelectric ceramic plate arranged in the metal box is closely and fixedly bonded to a bottom plate of the metal box; and wires of the piezoelectric ceramic plate penetrate through the wire through hole to be connected to an external impedance analyzer.

2. The reusable piezoelectric sensor for damage identification according to claim 1, wherein the bottom plate of the metal box is a 0.4-0.6 mm thick thin iron plate.

3. The reusable piezoelectric sensor for damage identification according to claim 2, wherein the 1.5-2 mm thick striking face, the remaining 1-1.5 mm thick side walls, and the 1-1.5 mm thick top plate of the metal box are all made of iron.

4. The reusable piezoelectric sensor for damage identification according to claim 3, wherein the metal box is superficially coated with zinc.

5. The reusable piezoelectric sensor for damage identification according to claim 4, wherein the bottom plate and the top plate of the metal box are square, and the piezoelectric ceramic plate is a 0.4 mm thick wafer having an electromechanical coupling coefficient not less than 0.56 and a diameter of 16 mm, and is arranged in a center of the bottom plate of the metal box.

6. The reusable piezoelectric sensor for damage identification according to claim 3, wherein the bottom plate and the top plate of the metal box are square, and the piezoelectric ceramic plate is a 0.4 mm thick wafer having an electromechanical coupling coefficient not less than 0.56 and a diameter of 16 mm, and is arranged in a center of the bottom plate of the metal box.

7. The reusable piezoelectric sensor for damage identification according to claim 6, wherein two flexible wires wrapped with insulating layers are welded to the piezoelectric ceramic plate.

8. The reusable piezoelectric sensor for damage identification according to claim 2, wherein the bottom plate and the top plate of the metal box are square, and the piezoelectric ceramic plate is a 0.4 mm thick wafer having an electromechanical coupling coefficient not less than 0.56 and a diameter of 16 mm, and is arranged in a center of the bottom plate of the metal box.

9. The reusable piezoelectric sensor for damage identification according to claim 8, wherein two flexible wires wrapped with insulating layers are welded to the piezoelectric ceramic plate.

10. The reusable piezoelectric sensor for damage identification according to any claim 1, wherein the bottom plate and the top plate of the metal box are square, and the piezoelectric ceramic plate is a 0.4 mm thick wafer having an electromechanical coupling coefficient not less than 0.56 and a diameter of 16 mm, and is arranged in a center of the bottom plate of the metal box.

11. The reusable piezoelectric sensor for damage identification according to claim 10, wherein two flexible wires wrapped with insulating layers are welded to the piezoelectric ceramic plate.

12. The reusable piezoelectric sensor for damage identification according to claim 11, wherein two flexible wires wrapped with insulating layers are welded to the piezoelectric ceramic plate.

* * * * *